(12) United States Patent
Chen et al.

(10) Patent No.: US 11,698,591 B2
(45) Date of Patent: Jul. 11, 2023

(54) SYSTEM AND METHOD OF DISCHARGING AN EUV MASK

(71) Applicant: Taiwan Semiconductor Manufacturing Co., Ltd., Hsinchu (TW)

(72) Inventors: Yi-Zhen Chen, Hsinchu (TW); Yen-Hsun Chen, Hsinchu (TW); Jhan-Hong Yeh, Hsinchu (TW); Tzung-Chi Fu, Hsinchu (TW); Han-Lung Chang, Hsinchu (TW); Li-Jui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/463,328

(22) Filed: Aug. 31, 2021

(65) Prior Publication Data
US 2023/0060598 A1    Mar. 2, 2023

(51) Int. Cl.
*G03F 7/20* (2006.01)
*G03F 7/00* (2006.01)
(52) U.S. Cl.
CPC ...... *G03F 7/70741* (2013.01); *G03F 7/70033* (2013.01); *G03F 7/70916* (2013.01)
(58) Field of Classification Search
CPC ............. G03F 7/70741; G03F 7/70033; G03F 7/70916; G03F 1/66; G03F 1/82; G03F 7/70875; H01L 21/67051; H01L 21/67775; H01L 21/67376; H01L 21/67386; H01L 21/67028; H01L 21/67393; H01L 21/67359; G03B 27/52
See application file for complete search history.

(56) References Cited

U.S. PATENT DOCUMENTS

| 6,196,391 | B1 * | 3/2001 | Li ........................ G03F 7/70741 206/719 |
| 2007/0211232 | A1 * | 9/2007 | Phillips .................. G03B 27/52 355/75 |

FOREIGN PATENT DOCUMENTS

TW    201708081 A    3/2017

* cited by examiner

*Primary Examiner* — Mesfin T Asfaw
(74) *Attorney, Agent, or Firm* — Seed IP Law Group

(57) ABSTRACT

An EUV photolithography system utilizes a baseplate of an EUV pod to unload an EUV reticle from a chuck within an EUV scanner. The baseplate includes a top surface and support pins extending from the top surface. The when the reticle is unloaded onto the baseplate, the support pins hold the reticle at relatively large distance from the top surface of the baseplate. The support pins have a relatively low resistance. The large distance and low resistance help ensure that particles do not travel from the baseplate to the reticle during unloading.

20 Claims, 6 Drawing Sheets

US 11,698,591 B2

SYSTEM AND METHOD OF DISCHARGING AN EUV MASK

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, due to the miniscule size of features to be transferred from the reticle to the integrated circuits, if even very small particles or debris fall onto the face of the reticle, then the photolithography processes may be corrupted and the resulting integrated circuits will not be functional.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
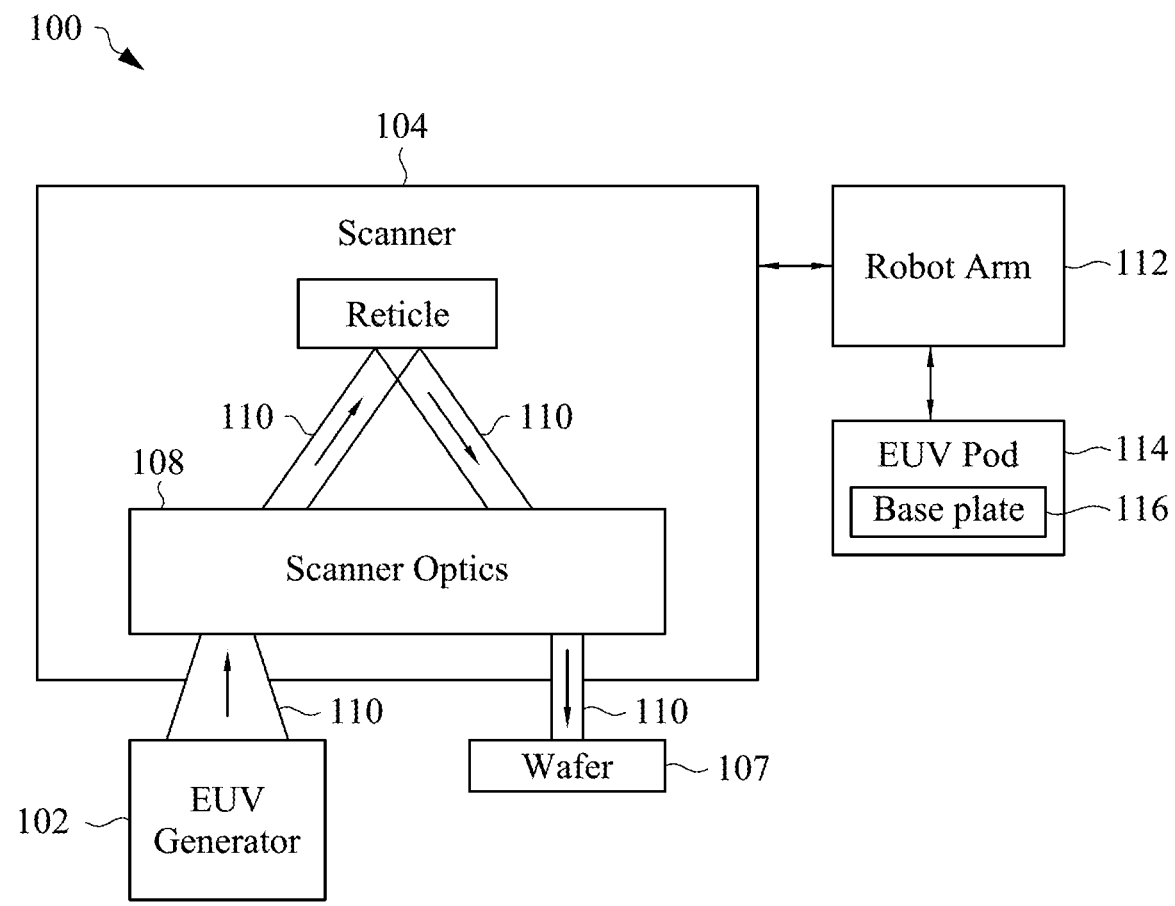
FIG. 1 is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to EUV photolithography systems. Embodiments of the present disclosure reduce contamination of an EUV reticle while unloading the EUV reticle from a scanner chuck onto the baseplate of an EUV transfer and storage pod. The baseplate includes support pins that extend from a top surface of the baseplate. When the reticle is placed on the baseplate, the reticle rests on the support pins. The support pins have a low electrical resistance so that an electrostatic charge between the top surface of the baseplate and the reticle can be quickly discharged through the storage pins. Furthermore, the support pins extend a comparatively large distance above the top surface of the baseplate so that there is a relatively large distance between the top surface of the baseplate and the exposure surface of the reticle. The electric field resulting from the buildup of electrostatic charge between the top surface of the baseplate and the exposure surface of the reticle can result in charged debris or particles traveling from the top surface of the baseplate to the bottom exposure surface of the reticle. However, the relatively large gap combined with the rapid discharge of the electrostatic charge through the support pins greatly reduces the probability that charged debris will travel from the baseplate to the reticle and contaminate the reticle. The result is that EUV photolithography processes will not be disrupted or corrupted by the presence of debris on the exposure surface of the reticle. Wafer yields will improve and expensive reticles will not need to be replaced.

FIG. 1 is a block diagram of an EUV photolithography system 100, according to some embodiments. The EUV photolithography system includes an EUV generator 102, an EUV scanner 104, and an EUV reticle 106 positioned in the scanner 104. The EUV generator 102, the EUV scanner 104, and the reticle 106 perform photolithography processes on a wafer 107. The photolithography system 100 also includes a robot arm 112 and an EUV pod 114. As will be set forth in more detail below, the components of the EUV photolithography system 100 cooperate to perform photolithography processes and to ensure that the reticle 106 is not contaminated when unloading the reticle 106 onto the baseplate 116 of the EUV pod 114.

The EUV generator 102 generates EUV light 110. As used herein, the terms "EUV light" and "EUV radiation" can be utilized interchangeably. In some embodiments, the EUV light 110 has a wavelength between 10 nm and 15 nm. In one example, the EUV light 110 has a central wavelength of 13.5 nm. In photolithography processes, one of the factors that affects the size of features that can be formed in a wafer is the wavelength of the light utilized in the photolithography processes. Because EUV light has a very small wavelength, EUV light can be utilized to define very small features on the wafer 107. Different EUV generation processes can provide different wavelength ranges of EUV light and different center wavelengths. Accordingly, the EUV light 110 can have different ranges of wavelengths and different center wavelengths than those described above without departing from the scope of the present disclosure.

In some embodiments, the EUV generator 102 is a laser produced plasma (LPP) EUV generation system. The photolithography system 100 includes a laser, a droplet generator, and a droplet receiver. The laser, the collector mirror, and the droplet generator cooperate to generate EUV radiation within the EUV generator 102.

The droplet generator generates and outputs a stream of droplets. The droplets can include tin, though droplets of other material can be utilized without departing from the scope of the present disclosure. The droplets move at a high rate of speed toward the droplet receiver. In some embodiments, the droplet generator generates between 40,000 and 100,000 droplets per second. The droplets have an initial velocity of between 60 m/s to 200 m/s. The droplets have a diameter between 10 μm and 200 μm. The droplet generator can generate different numbers of droplets per second than described above without departing from the scope of the present disclosure. The droplet generator can also generate droplets having different initial velocities and diameters than those described above without departing from the scope of the present disclosure.

The laser is positioned behind the collector mirror. During operation, the laser outputs pulses of laser light. The pulses of laser light are focused on a point through which the droplets pass on their way from the droplet generator to the droplet receiver. Each pulse of laser light is received by a droplet. When the droplet receives the pulse of laser light, the energy from the laser pulse generates a high-energy plasma from the droplet. The high-energy plasma outputs EUV light 110.

In some embodiments, the laser is a carbon dioxide ($CO_2$) laser. The $CO_2$ laser emits radiation or laser light with a wavelength centered around 9.4 μm or 10.6 μm. The laser can include lasers other than carbon dioxide lasers and can output radiation with other wavelengths than those described above without departing from the scope of the present disclosure.

In some embodiments, the laser irradiates each droplet with two pulses. A first pulse causes the droplet to flatten into a disk like shape. The second pulse causes the droplet to form a high temperature plasma. The second pulse is significantly more powerful than the first pulse. The laser and the droplet generator are calibrated so that the laser emits pairs of pulses such that each droplet is irradiated with a pair of pulses. For example, if the droplet generator outputs 50,000 droplets per second, the laser will output 50,000 pairs of pulses per second. The laser can irradiate droplets in a manner other than described above without departing from the scope of the present disclosure. For example, the laser may irradiate each droplet with a single pulse or with more pulses than two. Moreover, the primary laser here can not only cause droplets to flatten into disk-like shape can be mist or vapor state.

In some embodiments, the droplets are tin. When the tin droplets are converted to a plasma, the tin droplets output EUV light 110 with a wavelength centered between 10 nm and 15 nm. More particularly, in some embodiments, the tin plasma emits EUV radiation with a central wavelength of 13.5 nm. These wavelengths correspond to EUV radiation. Materials other than tin can be used for the droplets without departing from the scope of the present disclosure. Such other materials may generate EUV radiation with wavelengths other than those described above without departing from the scope of the present disclosure.

In some embodiments, the light 110 output by the droplets scatters randomly in many directions. The photolithography system 100 utilizes the collector mirror to collect the scattered EUV light 110 from the plasma and output the EUV light toward the scanner 104.

The scanner 104 includes scanner optics 108. The scanner optics 108 include a series of optical conditioning devices to direct the EUV light 110 to the reticle 106. The scanner optics 108 may include refractive optics such as a lens or a lens system having multiple lenses (zone plates). The scanner optics 108 may include a reflective optics, such as a single mirror or a mirror system having multiple mirrors. The scanner optics 108 direct the ultraviolet light 110 from the EUV generator 102 to the reticle 106. Further details regarding the reticle 106 are provided further below.

The ultraviolet light 110 reflects off of the reticle 106 back toward further optical features of the scanner optics 108. In some embodiments, the scanner optics 106 include a projection optics box. The projection optics box may have refractive optics, reflective optics, or combination of refractive and reflective optics. The projection optics box may include a magnification less than 1, thereby reducing the patterned image included in the EUV light 110 reflected from the reticle 106. The projection optics box directs the EUV light onto the wafer 107.

The EUV light 110 includes a pattern from the reticle 106. In particular, the reticle 106 includes the pattern to be defined in the wafer 107. After the EUV light 110 reflects off of the reticle 106, the EUV light 110 contains the pattern of the reticle 106.

A layer of photoresist typically covers the target during extreme ultraviolet photolithography irradiation. The photoresist assists in patterning a surface of the semiconductor wafer in accordance with the pattern of the reticle 106.

The projection optics box focuses the extreme ultraviolet light onto the wafer 107. The extreme ultraviolet light irradiates the photoresist with a pattern corresponding to the pattern of the reticle 106. The exposed portions of the photoresist undergo a chemical change that enables portions of the photoresist to be removed. This pattern leaves photoresist on the surface of the semiconductor wafer in a pattern of the reticle 106. Etching processes, thin film deposition processes, and/or doping processes are performed in the presence of the patterned photoresist.

Typically, a large number of reticles are utilized during fabrication of a single semiconductor wafer. Each reticle has a particular pattern corresponding to semiconductor fabrication processes. One or more etching, deposition, or doping processes are performed in accordance with each reticle.

If there are defects in the reticle 106, then corresponding defects may occur in the various semiconductor processes associated with the reticle 106. The defects that propagate from the reticle 106 to the fabrication processes can result in semiconductor devices that do not function properly. Semiconductor devices that do not function properly represent a waste of large amounts of resources due to the large amount of time, expensive tools, and expensive materials utilized to fabricate each semiconductor device. Accordingly, it is beneficial to reduce as many defects as possible in the reticle 106. Furthermore, it can be very expensive to replace a damaged or contaminated reticle.

One type of contamination that can affect the reticle 106 is particles or debris that have landed on the exposure surface (the downward facing surface) of the reticle 106. If a particle lands on the exposure surface of the reticle 106, then the shape of the particle can be incorporated into the pattern imparted to the EUV light 110 upon reflecting off of the reticle 106. This pattern is then transferred to the wafer 107. The pattern of the particle results in defects in the wafer 107. These defects can be fatal to the integrated circuits that will be diced from the wafer 107.

In order to reduce the possibility of contamination of the exposure surface of the reticle 106, the EUV system 100 includes an EUV pod 114. The EUV pod 114 is a storage and protection pod that encloses and protects the reticle 106 when the reticle 106 is not in use. After the reticle 106 has been initially manufactured, the reticle 106 may immediately be enclosed in the EUV pod 114. The reticle 106 remains in the EUV pod 114 during transport from the manufacturing site to the wafer processing site. The reticle 106 remains in the EUV pod 114 until the reticle 106 is to be utilized in the EUV photolithography process. At this time, the reticle 106 is transferred from the EUV pod 114 into the scanner 106. The EUV pod 114, or portions of the EUV pod 114 may be carried into the scanner 104. The reticle 106 is then unloaded from the EUV pod onto a chuck (not shown) in the scanner 106. The chuck holds the reticle 106 during the EUV process. After the EUV process, the reticle 106 is unloaded from the chuck to the EUV pod 114. The EUV pod 114 is designed to ensure that no particles can contaminate the reticle 106 when the reticle 106 is not in use.

The EUV pod 114 includes a baseplate 116. When the reticle 106 is in the EUV pod 114, the reticle supported on the baseplate 116. More particularly, the reticle 106 rests on support pins extending from a top surface of the baseplate 116. When the reticle 106 is loaded from the EUV pod 114 to the chuck in the scanner 104, a robot arm 112 carries the baseplate 114 from the EUV pod 114 to the scanner 104. The robot arm 112 lifts the baseplate 116 to the chuck and the reticle 106 is then secured by the chuck. The robot arm 112 then carries the baseplate 116 out of the scanner 104.

After the reticle 106 has been loaded onto the chuck, the EUV photolithography process is performed as described above. The EUV generator 102 generates the EUV light 110, the scanner optics 108 condition the EUV light 110 and direct the EUV light 110 onto the reticle 106. The EUV light 110 that reflects with a pattern from the reticle 1062 additional scanner optics 108. The light 110 is then directed onto the wafer 107.

After the photolithography process, the robot arm 112 carries the baseplate 116 into the scanner 104. The robot arm 112 positions the baseplate below the reticle 106 and raises the baseplate 116 until the support pins contact the reticle 106. The chuck then releases the reticle 106. The robot arm 112 carries the baseplate 116 with the reticle 106 out of the scanner 104. The EUV pod 114 is then reassembled around the reticle 106 so that the reticle 106 is enclosed within the EUV pod. Although a single robot arm 112 is shown in FIG. 1, in practice there may be multiple robotic arms or other transport devices that transport and assemble the EUV pod 114. Furthermore, the baseplate 116 and the reticle 114 may be removed from the EUV pod 114 within the scanner 104 prior to loading the reticle 106 onto the chuck. Additionally, the EUV pod 114 may be assembled around the reticle within the scanner 104 after unloading the reticle 106 from the chuck.

A possible source of contamination of the reticle 106 occurs while unloading the reticle 106 from the chuck onto the baseplate 114. This is because during the EUV process an electrostatic charge may develop at the exposure surface of the reticle 106. When the baseplate 116 is positioned below the reticle 106 during unloading of the reticle 106 from the chuck, an electric field develops between the exposure surface of the reticle 106 and the top surface of the baseplate 116. The baseplate 160 may include a conductive material such as nickel, aluminum, titanium, or other suitable materials. During unloading, there develops on the top surface of the baseplate 116 an electrostatic charge opposite to the electrostatic charge on the exposure surface of the reticle 106. An electric field develops between the top surface of the baseplate 116 and exposure surface of the reticle 106. The electric field may attract debris or particles that carry a net charge toward the exposure surface of the reticle 106. If this debris contacts the exposure surface of the reticle 106, then the reticle 106 becomes contaminated and future EUV photolithography processes may be corrupted.

The situation may be modeled as a capacitor with a top plate and a bottom plate facing each other. The top plate is the reticle 106. The bottom plate is the baseplate 116 of the EUV pod 114. The capacitance C of the capacitor is given by the equation:

$$C=\varepsilon*A/d,$$

where $\varepsilon$ is the dielectric constant of the material or void between the reticle 106 and the baseplate 116, A is the overlapping area of the exposure surface of the reticle 106 and the top surface of the baseplate 116, and d is the distance between the exposure surface of the reticle 106 and the top surface of the baseplate 116. The voltage V that develops between the plates of the capacitor is given by the equation:

$$V=Q/C,$$

where Q is the accumulated charge on either of the plates of the capacitor. The electric field E between the two plates is based on the voltage between the two plates in accordance with the following equation:

$$E=V/d.$$

A charged particle on the top surface of the baseplate 116 will experience an electric force $F_E$ toward the reticle 106 in accordance with the following equation:

$$F_E=q*E,$$

where q is the net charge on the particle. Because the baseplate 116 is below the reticle 106, the particle will also experience a downward gravitational force $F_G$ in accordance with the following equation:

$$F_G=m*g,$$

where g is the acceleration of gravity and m is the mass of the particle. The net force F experienced by the particle is $$F=F_E-F_G.$$

If $F_E$ is greater than $F_G$, then the particle will experience an upward acceleration toward the exposure surface of the reticle 106. The acceleration a is given by the following equation:

$$a=(F_E-F_G)/m.$$

As mentioned previously, the support pins of the baseplate are utilized to discharge the electrostatic charge on the exposure surface of the reticle 106. The baseplate 116 is grounded. When the reticle 106 is in contact with the support pins, current can flow through the support pins from the reticle 106 to the baseplate 116. The magnitude of the current is based, in part, on the resistance of the support pins. A lower resistance results in higher discharge currents and reduced discharge times.

At the moment that the reticle 106 contacts the support pins, the electric field between the reticle 106 and the baseplate 116 has an initial value of E0. Upon contact, the electrostatic charge begins to discharge through the pins and the electric field begins to decrease. The strength of the electric field E(t) over time is given by the equation:

$$E(t)=V(t)/d=E0*e^{\wedge}(-t/R*C),$$

where V(t) is the time-dependent voltage between the reticle 106 and the baseplate 116, t is time, and R is the collective resistance of the support pins. The time constant T associated with the discharge is given by the following equation:

$$\tau=R*C$$

By decreasing the discharge time, the maximum size of particles that can travel from the baseplate 116 to the exposure surface of the reticle 106 is also decreased. This is because the particles did not have sufficient time to travel to the baseplate 116 before the electric field dissipates and gravity pulls the particles back to the baseplate 116. As can be seen from the equations above, the discharge time can be reduced by decreasing the resistance of the support pins, thereby increasing the discharge current $I_D$. The discharge time can also be reduced by increasing the distance d between the top surface of the baseplate 116 and the exposure surface of the reticle 106.

In some embodiments, discharge times are reduced by providing support pins that have a resistance less than 2 M. The resistance of less than 2 MΩ can result in discharge time constants $\tau$ less than 1 ms. In a traditional system, the resistance of the support pins may be greater than 100 MΩ. When this is coupled with the fact that the gap d in traditional systems is 200 μm or less, the discharge time constant in traditional systems may be greater than 100 ms. Reducing the resistance R to less than 2 MΩ results in a much smaller discharge time. The smaller discharge time results in reducing the size of particles that can reach the exposure surface of the reticle 106.

In some embodiments, the support pins can include carbon nanotubes. Additionally, or alternatively, the support pins can include one or more of aluminum, copper, nickel, titanium, or other conductive or resistive materials. Various materials can be utilized for the support pins without departing from the scope of the present disclosure.

As set forth above, the discharge time constant $\tau$ is also proportional to the capacitance C between the exposure surface of the reticle 106 and the top surface of the baseplate 116. The capacitance is inversely proportional to the distance d between the exposure surface of the reticle 106 and the top surface of the baseplate 116. Accordingly, increasing the distance d can result in smaller disparage time constants $\tau$. As mentioned previously, traditional systems and utilized a gap of 200 μm or smaller between the top surface of the baseplate 116 and the exposure surface of the reticle 106. This was done in accordance with the assumption that a smaller gap would reduce the opportunity for outside particles to travel to the exposure surface of the reticle 106 and thereby enhance protection of the reticle 106. However, against conventional wisdom the inventors have realized that increasing the distance d between the reticle 106 and the baseplate 116 will reduce the total amount of contamination by reducing the amount of contamination that can occur while unloading the reticle 106 from the chuck onto the baseplate 116.

In some embodiments, the distance d is greater than 1 mm. This is more than five times the distance in traditional systems and results in a corresponding fivefold reduction in the discharge time constant. In some embodiments, the distance d is greater than 2 mm. This resulted a 10 fold reduction in the discharge time constant. In some embodiments, the distance d is about 2.5 mm. This balances the reduction in contamination during unloading with the interest in maintaining a relatively small gap between the baseplate and the reticle 106. Other distances d can be utilized without departing from the scope of the present disclosure.

In addition to decreasing the discharge time constant, increasing the gap d further reduces the size and number particles that can reach the exposure surface of the reticle 106 from the top surface of the baseplate 116 because there is a longer distance for the particle to travel. Furthermore, the magnitude of the electric field is reduced for a given voltage between the exposure surface of the reticle and the top surface of the baseplate 116. Accordingly, increasing the distance d can greatly reduce the size and number of particles that can contaminate the reticle 106.

Figure 2A:
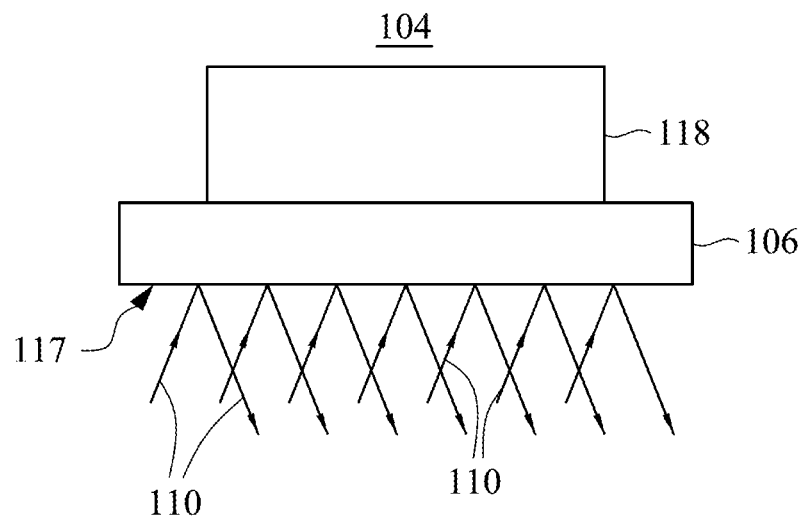
FIG. 2A-2C are illustrations of an EUV reticle in an EUV scanner, in accordance with some embodiments.
Figure 2B:
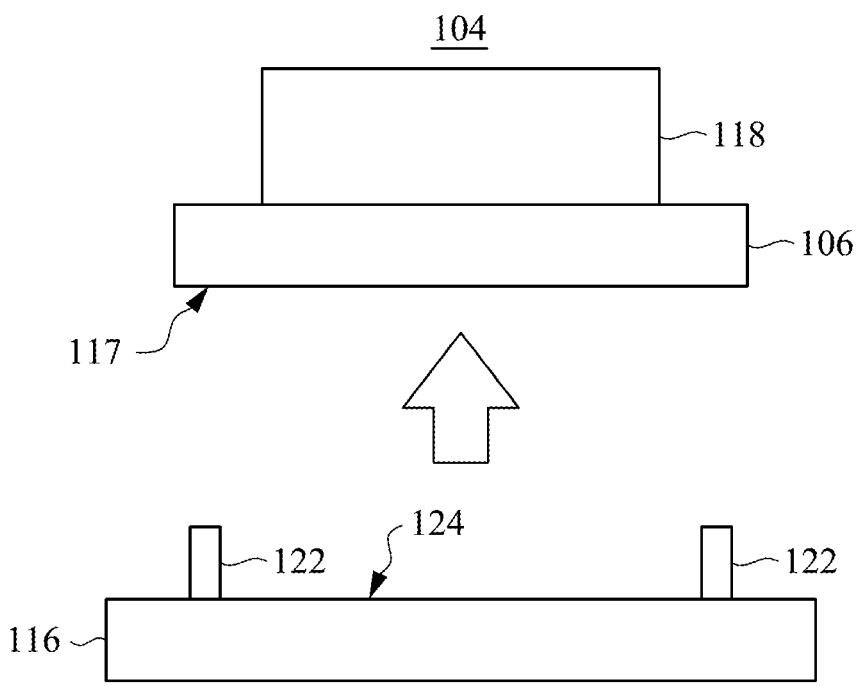

FIG. 2A is a simplified illustration of a chuck 118 holding a reticle 106 within a scanner 104 of an EUV photolithography system during an EUV photolithography process, according to some embodiments. The illustration of FIG. 2A is one example of a portion of the photolithography system 100 of FIG. 1.

The chuck 118 holds the reticle 106 with the exposure surface 117 of the reticle 106 facing downward. The exposure surface 117 includes a pattern for patterning the wafer 107 as described in relation to FIG. 1. EUV light 110 irradiates the exposure surface 117 of the reticle 106 within the scanner 104 and is reflected from the reticle 106 toward further optical components of the scanner 104. The further optical components focus the EUV light 110 onto the wafer and pattern the wafer as described previously.

After the EUV photolithography process is complete, the robot arm (see FIG. 1) carries the baseplate 116 of the disassembled EUV pod 114 into the scanner 104 in the vicinity of the reticle 106. The robot arm positions the baseplate 116 directly below the exposure surface 117 of the reticle 106. The robot arm then moves the baseplate 116 upward toward the exposure surface 117 of the reticle 106.

The baseplate 116 includes support pins 122 and a top surface 124. The support pins 122 extend upward from the top surface 124 of the baseplate 116. As described previously, the support pins 122 can be made of carbon nanotubes or from a combination of carbon nanotubes and various conductive or resistive materials. The support pins 122 may each have a resistance of less than 2 MΩ. Alternatively, or additionally, the support pins 122 may have a total parallel resistance of less than 2 M. The support pins 122 extend from the top surface 124 to a height greater than 1 mm above the top surface 124. The support pins 122 may extend to a height greater than 2 mm above the top surface 124 of the baseplate 116. In some embodiments, the support pins 122 extend to a height of about 2.5 mm above the top surface 124. In some cases, the exposure surface 117 of the reticle 106 may include indentations for receiving the support pins 122. In in these cases, the support pins 122 may have a total height that results in a separation of more than 1 mm, more than 2 mm, or about 2.5 mm when the support pins 122 are positioned in the indentations of the exposure surface 117. Other dimensions, resistances, and materials can be utilized for support pins 122 without departing from the scope of the present disclosure.

Figure 2C:
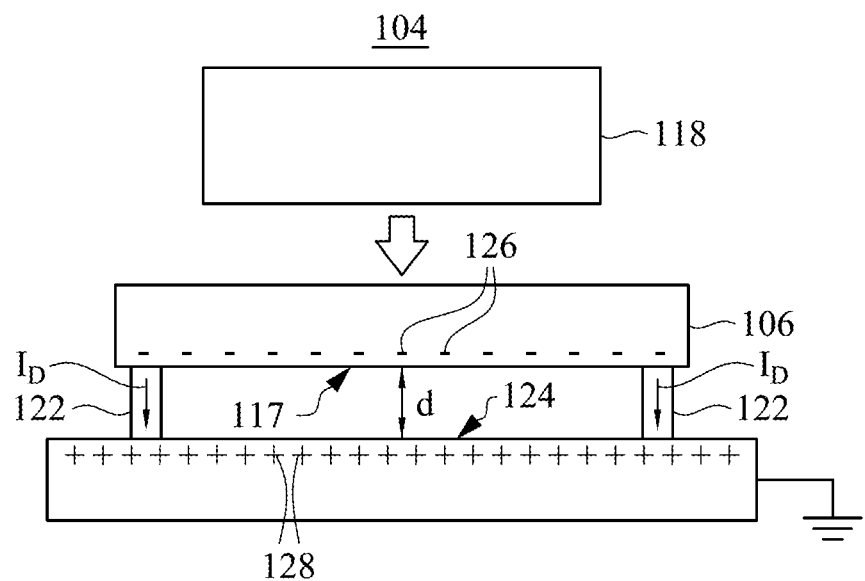

In FIG. 2C, the baseplate 116 has been brought into contact with the reticle 106. In particular, the support pins 122 of the baseplate 116 are in contact with the exposure surface 117 of the reticle 106. The chuck 118 has released the reticle 106. The robot arm (not shown) lowers the baseplate 116 holding the reticle 106 away from the chuck 118. The robot arm then carries the baseplate 116 and the reticle out of the scanner 104.

FIG. 2C also illustrates the electrostatic charge that has developed on the exposure surface 117 of the reticle 106. In the example of FIG. 2C, negative charges 126 have accumulated at exposure surface 117. Due to the capacitance between the top surface 124 of the baseplate 116 and exposure surface 117 of the reticle 106, positive charges 128 accumulate at the top surface 124 of the baseplate 116. As described previously, the baseplate 116 is grounded. The top surface 124 of the baseplate 116 is separated from the exposure surface 117 of the reticle 106 by distance d. In the example of FIG. 2C, the charge is 126 are negative and the charged 120 are positive. However, in some situations the polarities of the charges 126 and 120 a can be the opposite of that shown in FIG. 2C. In one example, the initial voltage is between 5 V and 6 V, though other voltage values are possible.

The electrical characteristics of the situation are described in relation to FIG. 1. In particular, an electric field develops between the top surface 124 of the baseplate 116 and the exposure surface 117 of the reticle 106. If there are loose particles carrying a net charge on the top surface 124 of the baseplate 116, then these loose particles will be accelerated by the electromagnetic force $F_E$ from the top surface 124 of the baseplate 116 to the exposure surface 117 of the reticle 106. The opportunity for such particles to reach the exposure surface 117 of the reticle 106 is limited due to the rapid discharge of the electrostatic charge. The rapid discharge occurs because of the relatively small resistance R of the support pins 122 and the relatively large distance d between the top surface 124 of the baseplate 116 and the exposure surface 117 of the reticle 106.

Though not illustrated in FIG. 2C, the discharge time is further decreased by continuing the generation of EUV light 110 during the unloading process. During the unloading process, a fluid is flowed into the scanner 104. The EUV light 110 generates a plasma from the fluid. As the plasma flows through the scanner 104, the plasma passes between the top surface 120 for the baseplate 116 and exposure surface 117 of the reticle 106. The interaction of the plasma with the exposure surface 117 carries away some of the charges 126, thereby decreasing the discharge time. In some embodiments, the fluid is hydrogen. The hydrogen is plasmatized by the EUV light 110 within the scanner 104. Other fluids can be utilized without departing from the scope of the present disclosure.

FIG. 2C illustrates a discharge current $I_D$ flowing downward through the support pins 122. While conventionally the direction of current flow corresponds to the direction of flow of positive charges, the downward direction of the current flow in FIG. 2C may illustrate the flow of electrons from the reticle 106 to the baseplate 116 through the support pins 122. Furthermore, when current is described as flowing from the reticle 106 to the baseplate 116 herein, this can correspond to either direction of travel of electrons.

Figure 2D:
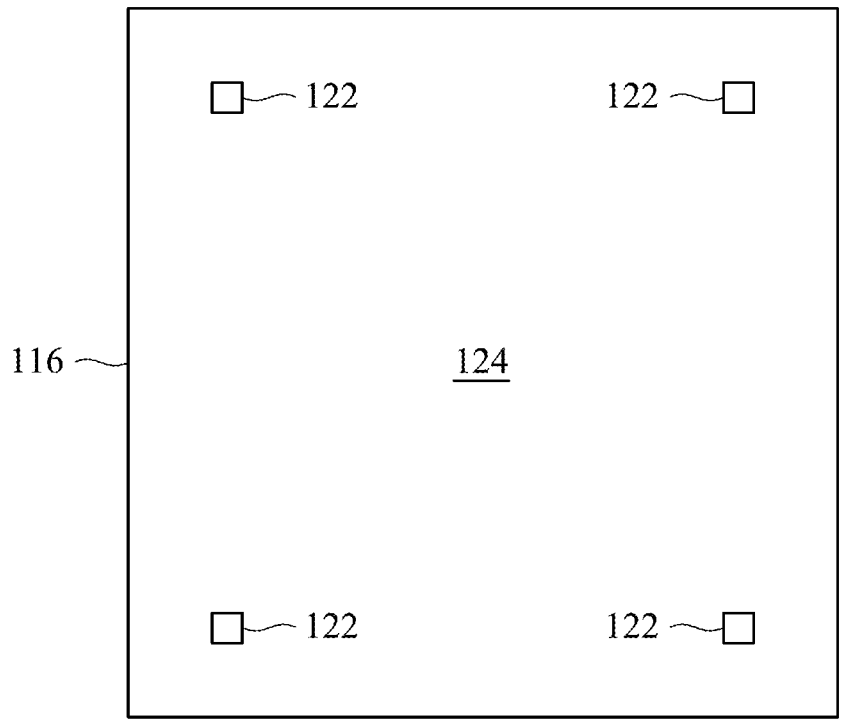
FIG. 2D is a top view of a baseplate of an EUV pod, in accordance with some embodiments.

FIG. 2D is a top view of the baseplate 120, according to some embodiments. In the example of FIG. 2D, the baseplate 116 includes four support pins 122 extending from the top surface 124 of the baseplate 116. Furthermore, each support pin is positioned near a corner of the baseplate 116. The support pins 122 are also illustrated as having a rectangular cross-section. However, the baseplate 116 can include different numbers of support pins 122, different arrangements of support pins 122, and support pins 122 having different shapes than shown in FIG. 2D. The reticle 106 may have indentations that align with the support pins 122 so that when the reticle 106 rests on the baseplate 116, the support pins 122 are in the indentations.

Figure 2E:
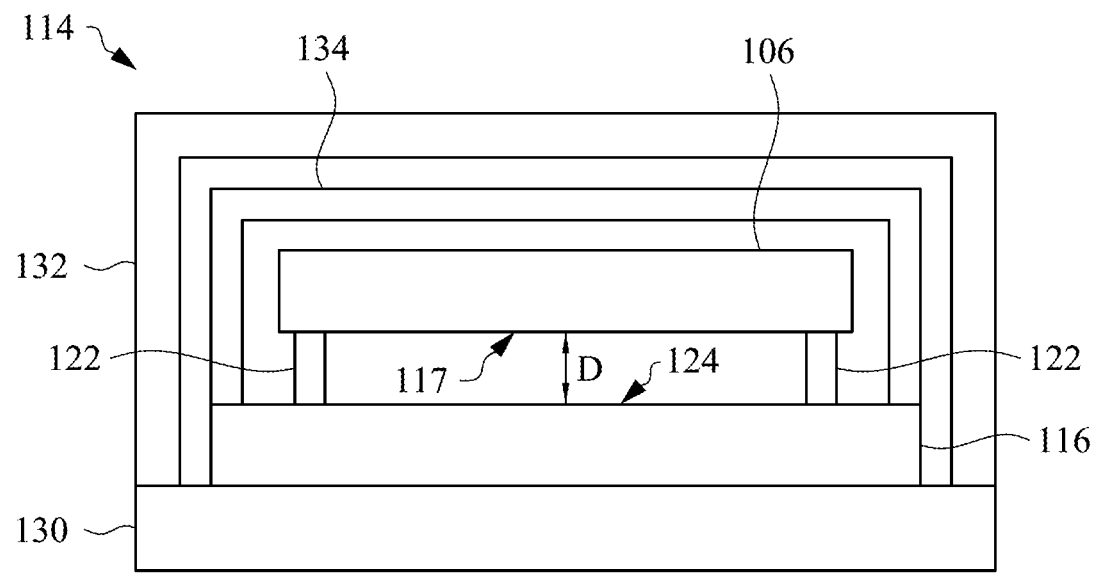
FIG. 2E is a side view of an EUV pod containing an EUV reticle, in accordance with some embodiments.

FIG. 2E is an illustration of an assembled EUV pod 114, according to some embodiments. After the reticle 106 is positioned on the baseplate 116 as shown in FIG. 2D, the robot arm 112 (not shown), or multiple robotic devices, places a cover plate 134 over the reticle 106. The cover plate 134 rests on the baseplate 116. The cover plate 134 and the baseplate 116 collectively enclose the reticle 106. The robot arm 112, or multiple robotic devices, place the baseplate 116 on a bottom shell 130. The top shell 132 is then placed on the bottom shell 130. The top shell 132 and the bottom shell 130 collectively enclose the baseplate 116 and the cover plate 134. The EUV pod 114 includes the bottom shell 130, the top shell 132, the cover plate 134, and the baseplate 116.

With the reticle 106 enclosed within the EUV pod 114, the robot arm 112 places the EUV pod 114 into storage.

Figure 2F:
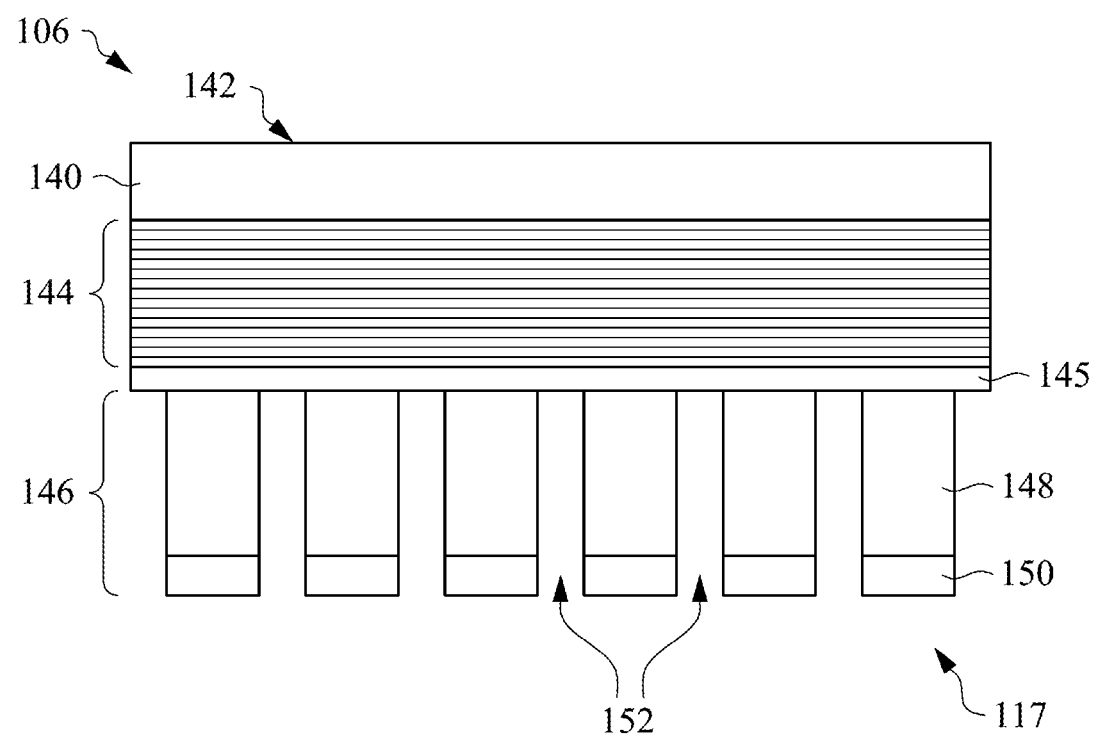
FIG. 2F is a side view of an EUV reticle, in accordance with some embodiments.

FIG. 2F is an illustration of a reticle 106, according to some embodiments. The reticle 106 is one example of a reticle in accordance with FIGS. 1-2E. The reticle 106 includes a substrate 140, a reflective multilayer 144 positioned on the substrate 140, a buffer layer 145 positioned on the reflective multilayer 144 and an absorption layer 146 positioned on the buffer layer 145. The substrate 140 includes a back surface 142. The back surface 142 can be considered the surface of the reticle 106 that is opposite the exposure surface 117. The fabrication process of the reticle 106 eventually results in the reticle 106 having a selected pattern in the absorption layer 146. In the example of FIG. 2F, the pattern is indicated by the trenches 152 in the absorption layer 146. The exposure surface 117 can correspond to the exposed surface of the absorption layer 146, the exposed surface of the buffer layer 145, or the combination of the top surface of the exposed surface of the absorption layer 146 and the exposed surface of the buffer layer 145. The reticle 106 can include other structures and arrangements without departing from the scope of the present disclosure.

The substrate 140 includes a low thermal expansion material. The low thermal expansion material substrate 140 serves to minimize image distortion due to heating of the reticle 106. The low thermal expansion material substrate 140 can include materials with a low defect level and a smooth surface.

In some embodiments, the substrate 140 can include $SiO_2$. The substrate 140 can be doped with titanium dioxide. The substrate 140 can include other low thermal expansion materials than those described above without departing from the scope of the present disclosure.

Though not shown herein, in some embodiments the substrate 140 may be positioned on a conductive layer. The conductive layer can assist in electrostatically chucking the reticle 106 during fabrication and use of the reticle 106. In some embodiments, the conductive layer includes chromium nitride. The conductive layer can include other materials without departing from the scope of the present disclosure.

The reticle 106 includes the reflective multilayer 144. The reflective multilayer 144 is positioned on the substrate 140. The reflective multilayer 144 is configured to reflect the extreme ultraviolet light during photolithography processes in which the reticle 106 is used. The reflective properties of the reflective multilayer 144 are described in more detail below.

In some embodiments, the reflective multilayer 144 operates in accordance with reflective properties of the interface between two materials. In particular, reflection of light will occur when light is incident at the interface between two materials of different refractive indices. A greater portion of the light is reflected when the difference in refractive indices is larger.

The reflective multilayer 144 includes a plurality of pairs of layers. Each pair of layers includes a layer of a first material and a layer of a second material. The materials and thicknesses of the layers are selected to promote reflection and constructive interference of extreme ultraviolet light. In some embodiments, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 144 are selected based on the expected wavelength of extreme ultraviolet light used in the photolithography processes and the expected angle of incidence of the extreme ultraviolet light during the photolithography processes. The number of pairs of layers is between 20 pairs of layers and 60 pairs of layers, according to some embodiments. Other materials, thicknesses, numbers of pairs, and configurations of layers in the reflective multilayer 144 can be utilized without departing from the scope of the present disclosure. Other wavelengths of extreme ultraviolet light can be used without departing from the scope of the present disclosure.

In some embodiments, the buffer layer 145 is positioned on the reflective multilayer 144. One purpose of the buffer layer 145 is to protect the reflective multilayer during etching processes of the absorption layer 146. Accordingly, the buffer layer 145 includes materials that are resistant to etching by etching processes that etch the absorption layer 146. The etching processes and the materials of the absorption layer will be described in more detail below.

In some embodiments, the buffer layer 145 includes ruthenium. The buffer layer 145 can include compounds of ruthenium including ruthenium boride and ruthenium silicide. The buffer layer can include chromium, chromium oxide, or chromium nitride. The buffer layer 145 can be deposited by a low temperature deposition process to prevent diffusion of the buffer layer 145 into the reflective multilayer 144. In some embodiments, the buffer layer 145 has a thickness between 2 nm and 4 nm. Other materials, deposition processes, and thicknesses can be utilized for the buffer layer 145 without departing from the scope of the present disclosure.

The absorption layer 146 is positioned on the buffer layer 145. The material of the absorption layer 146 is selected to have a high absorption coefficient for wavelengths of extreme ultraviolet light that will be used in the photolithography processes with the reticle 106. In other words, the materials of the absorption layer 146 are selected to absorb extreme ultraviolet light.

In some embodiments, the absorption layer 146 is between 40 nm and 100 nm in thickness. In some embodiments, the absorption layer 146 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption layer 146 without departing from the scope of the present disclosure.

In some embodiments, the absorption layer 146 includes a first absorption layer 148 and a second absorption layer 150. The first absorption layer 146 is positioned on the buffer layer 145. The second absorption layer 150 is positioned on the first absorption layer 148.

In some embodiments, the first absorption layer 148 includes tantalum boron nitride. The second absorption layer 150 includes tantalum boron oxide. The thickness of the first absorption layer is between 30 nm and 80 nm. The thickness of the second absorption layer 150 is between 1 nm and 40 nm. The absorption layer 146 can include different materials, thicknesses, and numbers of layers than those described above without departing from the scope of the present disclosure. In some embodiments, the absorption layer 146 includes only a single absorption layer. Accordingly, the absorption layer 146 can be an absorption layer.

The layers of the reticle 106 shown in FIG. 2F may be formed by various thin-film deposition processes. The thin-film deposition processes can include including physical vapor deposition process such as evaporation and DC magnetron sputtering, a plating process such as electroless plating or electroplating, a chemical vapor deposition process such as atmospheric pressure chemical vapor deposition, low pressure chemical vapor deposition, plasma enhanced chemical vapor deposition, high density plasma chemical vapor deposition, ion beam deposition, spin-on coating, metal-organic decomposition, and/or other methods known in the art.

Figure 3:
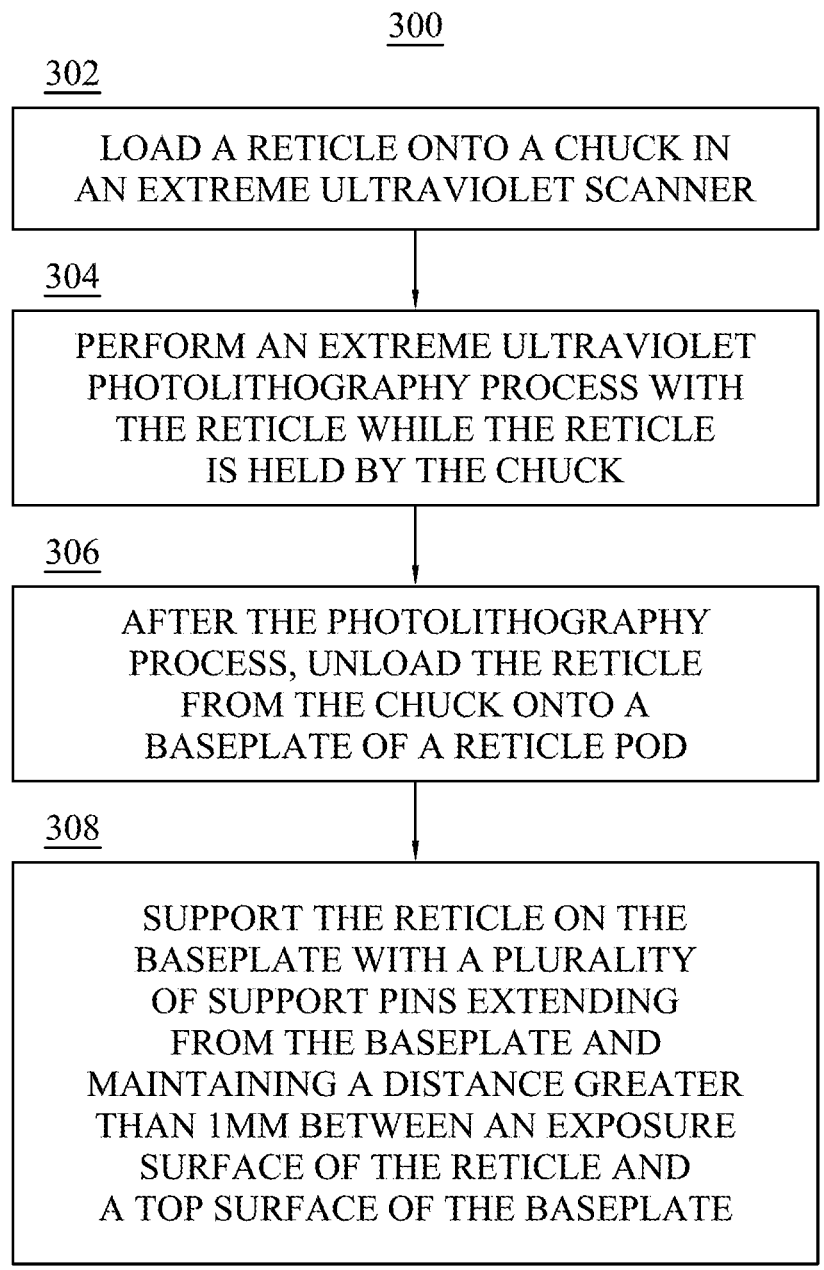
FIG. 3 is a flow diagram of a process for operating an EUV photolithography system, in accordance with some embodiments.

FIG. 3 is a flow diagram of a method 300, according to some embodiments. At 302, the method 300 includes loading a reticle onto a chuck in an extreme ultraviolet scanner. One example of a reticle is the reticle 106 of FIG. 1. One example of a chuck is the chuck 118 of FIG. 2A. At 304, the method 300 includes performing an extreme ultraviolet photolithography process with the reticle while the reticle is held by the chuck. At 306, 300 includes after the photolithography process, unloading the reticle from the chuck onto a baseplate of a reticle pod. One example of an EUV pod is the EUV pod 114 of FIG. 1. One example of a baseplate is the baseplate 116 of FIG. 1. At 308, the method 300 supporting the reticle on the baseplate with a plurality of support pins extending from the baseplate and maintaining a distance greater than 1 mm between an exposure surface of the reticle and a top surface of the baseplate.

Figure 4:
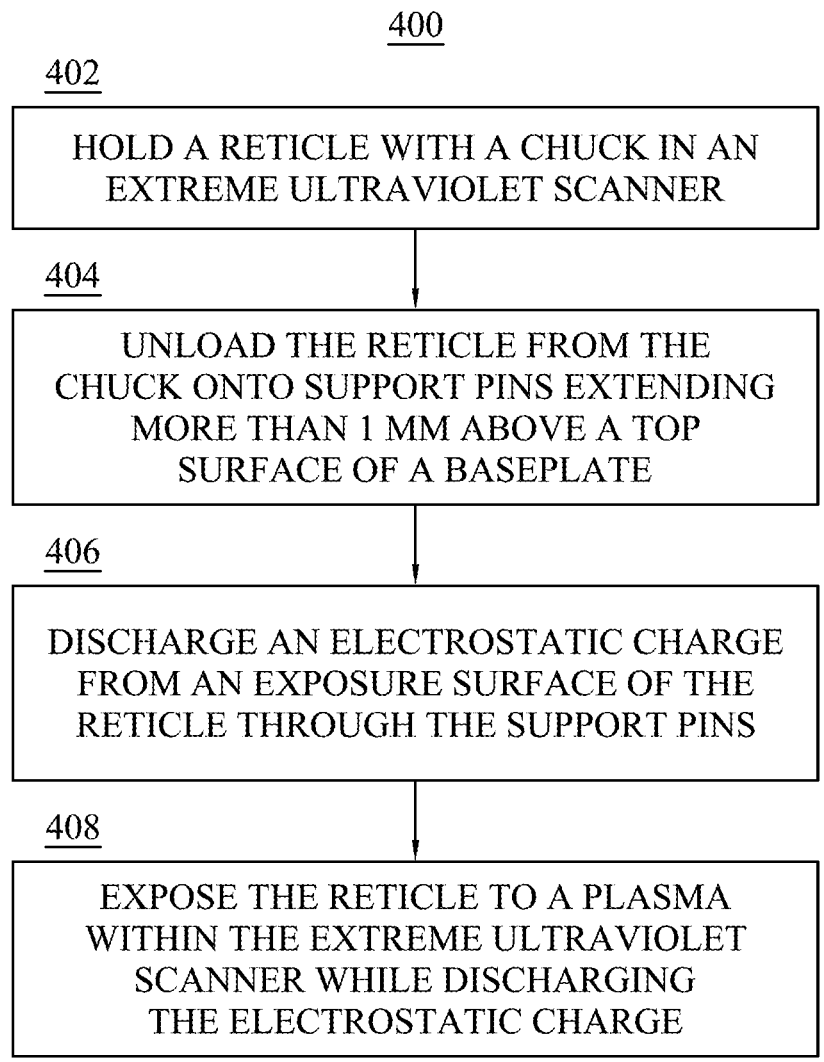
FIG. 4 is a flow diagram of a process for operating an EUV photolithography system, in accordance with some embodiments.

FIG. 4 is a flow diagram of a method 400, according to some embodiments. At 402, the method 400 includes holding a reticle with a chuck in an extreme ultraviolet scanner. One example of a reticle is the reticle 106 of FIG. 2A. One example of a chuck is the chuck 118 of FIG. 2A. One example of a scanner is the scanner 104 of FIG. 2A. At 404, the method 400 includes unloading the reticle from the chuck onto support pins extending more than 1 mm above a top surface of a baseplate. One example of support pins is the support pins 122 of FIG. 2B. One example of a baseplate is the baseplate 116 of FIG. 2B. At 406, the method 400 includes discharging an electrostatic charge from an exposure surface of the reticle through the support pins. One example of an exposure surface is the exposure surface 117 of FIG. 2B. At 408, the method 400 includes exposing the reticle to a plasma within the extreme ultraviolet scanner while discharging the electrostatic charge.

In some embodiments, a method includes loading a reticle onto a chuck in an extreme ultraviolet scanner and performing an extreme ultraviolet photolithography process with the reticle while the reticle is held by the chuck. The method includes, after the photolithography process, unloading the reticle from the chuck onto a baseplate of a reticle pod and supporting the reticle on the baseplate with a plurality of support pins extending from the baseplate and maintaining a distance greater than 1 mm between an exposure surface of the reticle and a top surface of the baseplate.

In some embodiments, an extreme ultraviolet pod for holding an extreme ultraviolet reticle includes a baseplate including a top surface and a plurality of support pins extending vertically from the baseplate and configured to support an exposure surface of an extreme ultraviolet reticle more than 1 mm above the top surface of the baseplate. The pod includes a shell configured to enclose the baseplate and the reticle when the reticle is supported on the baseplate by the support pins.

In some embodiments, a method includes holding a reticle with a chuck in an extreme ultraviolet scanner and unloading the reticle from the chuck onto support pins extending more than 1 mm above a top surface of a baseplate. The method includes discharging an electrostatic charge from an exposure surface of the reticle through the support pins and exposing the reticle to a plasma within the extreme ultraviolet scanner while discharging the electrostatic charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
loading a reticle onto a chuck in an extreme ultraviolet scanner;
performing an extreme ultraviolet photolithography process with the reticle while the reticle is held by the chuck;
after the photolithography process, unloading the reticle from the chuck onto a baseplate of a reticle pod;
supporting the reticle on the baseplate with a plurality of support pins extending from the baseplate and maintaining a distance greater than 1 mm between an exposure surface of the reticle and a top surface of the baseplate;
discharging an electrostatic charge from the exposure surface via the support pins while the reticle is in the extreme ultraviolet photolithography scanner; and
exposing the reticle to a plasma within the extreme ultraviolet scanner while discharging the electrostatic charge via the support pins.

2. The method of claim 1, wherein the support pins collectively provide an electrical resistance between the exposure surface of the reticle and the top surface of the baseplate less than 5 MΩ.

3. The method of claim 2, wherein the support pins collectively provide an electrical resistance between the exposure surface of the reticle and the top surface of the baseplate less than 2 MΩ.

4. The method of claim 1, wherein the support pins maintain the distance greater than 2 mm.

5. The method of claim 1, further comprising generating the plasma by passing extreme ultraviolet light into the scanner.

6. The method of claim 5, wherein generating the plasma includes flowing hydrogen into the scanner and ionizing the hydrogen in the scanner with the extreme ultraviolet light.

7. The method of claim 1, further comprising after unloading the reticle onto the baseplate, enclosing the reticle in an extreme ultraviolet pod including the baseplate below the reticle, a top plate above the reticle, and a shell enclosing the baseplate and the top plate.

8. The method of claim 1, wherein the support pins include carbon nanotubes.

9. An extreme ultraviolet pod for holding an extreme ultraviolet reticle, comprising:
a baseplate including a top surface;
a plurality of support pins extending vertically from the baseplate and configured to support an exposure surface of an extreme ultraviolet reticle more than 1 mm above the top surface of the baseplate; and a shell configured to enclose the baseplate and the reticle when the reticle is supported on the baseplate by the support pins, wherein the support pins include carbon nanotubes.

10. The extreme ultraviolet pod of claim 9, wherein the support pins collectively provide an electrical resistance of less than 5 MΩ between the exposure surface of the reticle and the top surface of the baseplate when the reticle is supported by the support pins.

11. The extreme ultraviolet pod of claim 9, wherein the support pins collectively provide an electrical resistance of less than 2 MΩ between the exposure surface of the reticle and the top surface of the baseplate when the reticle is supported by the support pins.

12. The extreme ultraviolet pod of claim 9, wherein the baseplate includes Ni.

13. The extreme ultraviolet pod of claim 9, wherein the support pins are configured to support the exposure surface of the extreme ultraviolet reticle more than 2 mm above the top surface of the baseplate.

14. A method, comprising:
holding a reticle with a chuck in an extreme ultraviolet scanner;
unloading the reticle from the chuck onto support pins extending more than 1 mm above a top surface of a baseplate;
discharging an electrostatic charge from an exposure surface of the reticle through the support pins; and
exposing the reticle to a plasma within the extreme ultraviolet scanner while discharging the electrostatic charge.

15. The method of claim 14, further comprising grounding the baseplate while discharging the electrostatic charge.

16. The method of claim 14 further comprising generating the plasma by passing extreme ultraviolet light into the scanner.

17. The method of claim 14 further comprising:
carrying the baseplate into the scanner with a robot arm prior to unloading the reticle; and
removing the baseplate and the reticle from the scanner with the robot arm after unloading the reticle.

18. The method of claim 17, further comprising enclosing the baseplate and the reticle in a pod after removing the baseplate and the reticle from the scanner.

19. The method of claim 14, wherein the support pins include carbon nanotubes.

20. The method of claim 14, comprising generating the plasma by passing extreme ultraviolet light into the scanner, flowing hydrogen into the scanner, and ionizing the hydrogen in the scanner with the extreme ultraviolet light.

* * * * *